US007300739B2

(12) United States Patent
Allen et al.

(10) Patent No.: US 7,300,739 B2
(45) Date of Patent: Nov. 27, 2007

(54) NEGATIVE RESISTS BASED ON A ACID-CATALYZED ELIMINATION OF POLAR MOLECULES

(75) Inventors: Robert David Allen, San Jose, CA (US); Gregory Breyta, San Jose, CA (US); Phillip Joe Brock, Sunnyvale, CA (US); Richard A. DiPietro, Campbell, CA (US); David R. Medeiros, Ossining, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 10/449,181

(22) Filed: May 29, 2003

(65) Prior Publication Data

US 2007/0026339 A1    Feb. 1, 2007

(51) Int. Cl.
*G03F 7/004* (2006.01)
*C08F 14/00* (2006.01)
*C08F 14/18* (2006.01)

(52) U.S. Cl. .................... 430/270.1; 526/72; 526/242; 526/244; 526/245; 526/247; 526/246; 526/250; 526/251; 526/254; 526/281

(58) Field of Classification Search ................ 526/242, 526/247, 281, 72, 244, 245, 246, 250, 251, 526/254
See application file for complete search history.

(56) References Cited

U.S. PATENT DOCUMENTS

| | | | |
|---|---|---|---|
| 5,998,092 A | | 12/1999 | McCulloch et al. |
| 6,368,770 B1 * | | 4/2002 | Jung et al. ............... 430/270.1 |
| 6,436,606 B1 * | | 8/2002 | Hatakeyama et al. .... 430/270.1 |
| 6,503,686 B1 * | | 1/2003 | Fryd et al. ............... 430/270.1 |
| 6,686,429 B2 * | | 2/2004 | Dammel et al. ............ 526/297 |
| 6,740,470 B2 * | | 5/2004 | Tan et al. ................ 430/271.1 |
| 6,756,180 B2 * | | 6/2004 | Li et al. ................... 430/270.1 |
| 6,764,809 B2 * | | 7/2004 | DeSimone et al. .......... 430/313 |
| 6,790,587 B1 * | | 9/2004 | Feiring et al. ............ 430/270.1 |
| 6,800,414 B2 * | | 10/2004 | Nishimura et al. ....... 430/270.1 |
| 6,806,026 B2 * | | 10/2004 | Allen et al. .............. 430/270.1 |
| 6,878,501 B2 * | | 4/2005 | Hatakeyama et al. .... 430/270.1 |
| 6,964,840 B2 * | | 11/2005 | Nishimura et al. ....... 430/270.1 |
| 2002/0136982 A1 | | 9/2002 | Goodall et al. |
| 2003/0008233 A1 | | 1/2003 | Hada et al. |

OTHER PUBLICATIONS

Brunner et al. (2001), "Optimum Tone for Various Feature Types: Positive Versus Negative," *Advances in Resist Technology and Processing XVIII, Proceedings of SPIE 4345*:30-36.
Cho et al. (2000), "Negative Tone 193 nm Resists," *Advances in Resist Technology and Processing XVII, Proceedings of SPIE 3999*:62-73.
Fu et al. (2001), "Negative-Tone Cycloolefin Photoresist for 193 nm Lithography," *Advances in Resist Technology and Processing XVIII, Proceedings of SPIE 4345*:751-760.
Ito et al. (1992), "Negative Resist Compositions," *IBM Technical Disclosure Bulletin 35*(1B):397.
Ito et al. (1992), "Acid-Catalyzed Dehydration: A New Mechanism for Chemically Amplified Lithographic Imaging," *IBM Research Report, Chemistry RJ 8817 (78947)*, pp. 1-37.
Ito et al. (1994), "Dual-Tone and Aqueous Base Developable Negative Resists Based on Acid-Catalyzed Dehydration," *Polymeric Materials for Microelectronic Applications, Science and Technology, ACS Symposium Series 579*, Chapter 6, pp. 70-92, Polymers for Microelectronics 1993 Meeting, Nov. 15-19, 1993.
Yokoyama et al. (2001), "ArF Negative Resist System Using Androsterone Structure with δ-Hydroxy Acid for 100-nm Phase-Shifting Lithography," *Advances in Resist Technology and Processing XVIII, Proceedings of SPIE 4345*:58-66.

* cited by examiner

*Primary Examiner*—Amanda Walke
(74) *Attorney, Agent, or Firm*—Mintz, Levin, Cohn, Ferris, Glovsky and Popeo, P.C.

(57) ABSTRACT

The present invention provides polymers that are useful in negative resist compositions. Polymers of the present invention comprise (1) a first monomer having a polar functional group; (2) a second monomer; and optionally, (3) a third monomer that imparts at least one characteristic selected from crosslinkable functionality, etch resistance, and solubility modulation. The first monomer provides an acid catalyzed polarity switch upon elimination of the polar functional group, whereas, the second monomer provides aqueous dissolution. The polymers of the present invention may be incorporated into negative resist compositions, which may also include photoacid generators, crosslinking agents, basic compounds, solvents, dissolution accelerators, photobase generators, latent basic compounds, surfactants, adhesion promoters, and anti-foaming agents.

27 Claims, No Drawings

US 7,300,739 B2

NEGATIVE RESISTS BASED ON A ACID-CATALYZED ELIMINATION OF POLAR MOLECULES

TECHNICAL FIELD

This invention relates generally to the fields of polymer chemistry, lithography, and semiconductor fabrication. More specifically, the invention relates to monomers that are useful in lithographic photoresist ("resist") compositions, particularly in negative resist compositions.

BACKGROUND

Ongoing efforts are being made in the field of microelectronic devices to achieve higher circuit density. One method of increasing the number of components per chip is to decrease the minimum feature size on the chip, which requires higher lithographic resolution. This has been accomplished over the years by reducing the wavelength of the imaging radiation from the visible (436 nm) down to the ultraviolet (365 nm) and to the deep ultraviolet (DUV) at 248 nm. More recent efforts at developing commercial lithographic processes use ultra-deep ultraviolet radiation, particularly 193 nm and 157 nm. See, for example, Allen et al. (1995) *J. Photopolym. Sci. and Tech.* 8(4):623, and Abe et al. (1995) *J. Photopolym. Sci. and Tech.* 8(4):637.

Despite these developments, there are no negative resists that are commercially available for 193 nm and 157 nm lithography. A recent study suggests that negative resists may have a better process window than positive resists for printing narrow trench geometries. See Brunner et al. (2001), *Proc. SPIE* 4345, 30. Therefore, there is a need to develop negative resists for 193 nm and 157 nm lithography.

Commercial resist candidates for use in 248 nm lithography are all based on cross-linking mechanisms. The problem mostly encountered with cross-linking systems is the micro-bridging of the features, where tiny strings of undeveloped resist material are left in the space between resist lines. Unfortunately, micro-bridging would become more pronounced in 193 nm and 157 nm lithography because of the smaller features.

Another approach, the acid catalyzed polarity switch (from polar to non polar) for negative resists, has been proposed, but has never resulted in a commercial resist. The polarity switch mechanisms involve pinacol rearrangement (from diol to carbonyl) or dehydration of tertiary alcohols attached to styrene based polymers followed by the cross-linking of the vinyl styrene. See Ito et al. (1994) *Polymeric Materials for Microelectronic Applications, ACS Symposium Series* 579, American Chemical Society, Washington, DC, and references cited therein. Since these mechanisms are generally based on aromatic polymers (e.g., styrene based polymers), they are generally unsuitable for 193 nm and 157 nm lithography because aromatic polymers are opaque at 193 nm and 157 nm. These mechanisms also do not work well with standard developers. Recently, however, attempts have been made to apply a dehydration mechanism in cycloolefin polymers in order to develop 193 nm negative resists. See Fu et al. (2001) *Proc. SPIE* 4345, 751. However, an organic developer was needed to develop the resist.

Researchers have also attempted to use acid-catalyzed lactone formation of hydroxy acids for 193 nm negative resist development. See Yokoyama et al. (2001) *Proc. SPIE* 4345, 58, and references cited therein. This type of system normally requires a very weak developer, the product of which has poor shelf-life since the hydroxy acid slowly shifts back into the lactone at room temperature.

Therefore, there remains a need in the art to develop negative resists for 193 nm and 157 nm lithography. This invention addresses that need.

SUMMARY OF THE INVENTION

In one aspect of the invention, a polymer useful in negative resist compositions is provided that comprises (1) a first monomer having a polar functional group; and (2) a second monomer. The first monomer provides an acid catalyzed polarity switch upon elimination of the polar functional group. The second monomer, having a fluoroalcohol moiety, provides aqueous dissolution.

In another aspect of the invention, a polymer useful in negative resist compositions is provided that comprises (1) a first monomer having a polar functional group; (2) a second monomer; and (3) a third monomer that imparts at least one characteristic selected from crosslinkable functionality, etch resistance, and solubility modulation.

In another aspect of the invention, a polymer useful in negative resist compositions is provided that comprises (1) a first monomer having a polar functional group selected from the group consisting of fluoroalcohol moieties and carboxylic acids; and (2) a second monomer. The first monomer provides an acid catalyzed polarity switch upon elimination of the polar functional group, and the second monomer provides aqueous dissolution.

In yet another aspect of the invention, a polymer useful in negative resist compositions is provided that comprises (1) a first monomer having a polar functional group selected from the group consisting of fluoroalcohol moieties and carboxylic acids; (2) a second monomer; and (3) a third monomer that imparts at least one characteristic selected from crosslinkable functionality, etch resistance, and solubility modulation.

In an additional aspect of the invention, the aforementioned polymers are incorporated into a negative resist composition. The negative resist composition so provided will generally, although not necessarily, also include photo-acid generators, crosslinking agents, dissolution inhibitors, basic compounds, solvents, dissolution accelerators, photo-base generators, latent basic compounds, surfactants, adhesion promoters, and anti-foaming agents.

The negative resist composition is useful in processes for generating a negative resist image on a substrate by: (a) coating a substrate with a film of a negative resist composition of the invention; (b) exposing the film selectively to a predetermined pattern of radiation so as to form a latent, patterned image in the film; and (c) developing the latent image with a developer. The photoresist provides higher resolution and better performance than previous polymers and finds particular utility in 157 nm and 193 nm resist lithography.

DETAILED DESCRIPTION OF THE INVENTION

I. Definitions and Nomenclature

Unless otherwise indicated, this invention is not limited to specific compositions, components, or process steps. It should also be noted that the singular forms "a," "and," and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a straight or branched, saturated alkyl group typically although not necessarily containing 1 to about 24 carbon atoms, such as methyl, ethyl, n-propyl, isopropyl, n-butyl, isobutyl, t-butyl, octyl, decyl, tetradecyl, hexadecyl, eicosyl, tetracosyl, and the like. Generally, although not necessarily, alkyl groups herein contain 1 to about 12 carbon atoms. The term "lower alkyl" intends an alkyl group of 1 to 6 carbon atoms, and the term "cycloalkyl" intends a cyclic alkyl group, typically having 4 to 8, preferably 5 to 7, carbon atoms. The term "substituted alkyl" refers to alkyl substituted with one or more substituent groups, and the terms "heteroatom-containing alkyl" and "heteroalkyl" refer to alkyl in which at least one carbon atom is replaced with a heteroatom, e.g., O, S, or N. If not otherwise indicated, the terms "alkyl" and "lower alkyl" include linear, branched, unsubstituted, substituted, and/or heteroatom-containing alkyl and lower alkyl, respectively.

The term "alicyclic" is used to refer to cycloalkanes and cycloalkenes, including cycloalkyl and cycloalkenyl substituents and cycloalkylene and cycloalkenylene linkages. Often, the term refers to bridged bicyclic compounds, substituents, and linkages. Preferred alicyclic moieties herein contain 3 to about 15 carbon atoms. Unless otherwise indicated, the term "alicyclic" includes substituted and/or heteroatom-containing such moieties.

The term "substituted" as in "substituted alkyl," "substituted alicyclic," and the like, as alluded to in some of the aforementioned definitions, means that in the alkyl, alicyclic, or other moiety, at least one hydrogen atom bound to a carbon (or other) atom is replaced with a non-hydrogen substituent. Examples of such substituents include, without limitation, functional groups such as halide, hydroxyl, alkoxy, acyl (including alkylcarbonyl (—CO-alkyl) and arylcarbonyl (—CO-aryl)), acyloxy (—O—CO—), alkoxycarbonyl (—(CO)—O-alkyl), aryloxycarbonyl (—(CO)—O-aryl), and silyl (e.g., trialkylsilyl), and hydrocarbyl moieties such as alkyl, aryl, aralkyl (aryl-substituted alkyl), and alkaryl (alkyl-substituted aryl). The aforementioned functional groups may, if a particular group permits, be further substituted with one or more additional functional groups or with one or more hydrocarbyl moieties such as those specifically enumerated above, and analogously, the above-mentioned hydrocarbyl moieties may be further substituted with one or more functional groups or additional hydrocarbyl moieties such as those specifically enumerated.

As used herein the following chemical structures:

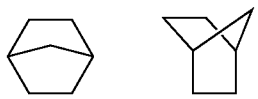

are used interchangeably and are intended to represent the same structure.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The terms "photogenerated acid" and "photoacid" are used interchangeably herein to refer to the acid that is created upon exposure of the present compositions to radiation.

The term "polymer" is used to refer to a chemical compound that comprises linked monomers, and that may be straight, branched, or crosslinked. The term also encompasses homopolymers, copolymers, terpolymers, and the like. The term "copolymer," unless specifically indicated otherwise, refers to a polymer containing at least two different monomer units, thus including block copolymers, alternating copolymers, random copolymers, and the like.

For additional information concerning terms used in the field of lithography and lithographic compositions, see *Introduction to Microlithography*, Eds. Thompson et al. (Washington, D.C.: American Chemical Society, 1994).

II. Polymer Design for use in Negative Resists

The present invention is directed to polymers that undergo acid-catalyzed elimination of polar functional groups for use in negative resist compositions. The polymers of this invention are usually copolymers or terpolymers that are initially aqueous base (developer) soluble. The polymer comprises a first monomer that has at least one polar functional group that can be eliminated in the presence of a photoacid, and a second monomer that provides aqueous dissolution. Preferably, the polar functional group is selected from the group consisting of alcohol moieties, fluoroalcohol moieties, and carboxylic acids. When a polymer of the invention is exposed to radiation, the radiation causes the formation of a photoacid, which upon heating, causes the elimination of the polar functional group, resulting in an aqueous base insoluble hydrophobic polymer. This transformation occurs rapidly. In other words, when a polymer of the invention undergoes a photoacid-induced elimination of polar functional group reaction, a polarity switch in the polymer occurs, thereby changing the solubility of the polymer from being soluble in an aqueous base to being insoluble in the aqueous base. After radiation exposure, the polymer can be treated with standard developers, which dissolve and remove the unexposed areas of the polymer. Cross-linking does not inherently occur in this process, and thus microbridging is not a problem.

In one embodiment of the invention, the first monomer has a polar functional group ($R_4$) that is attached as a tertiary ester, tertiary ether, or tertiary free alcohol, wherein the tertiary group is attached to the polymer backbone via a polymerizable group (RI). This monomer is depicted in formula (I).

wherein:

$R_1$ is a polymerizable group selected from the group consisting of acrylate, methacrylate, cyclic olefin, and vinyl moieties;

$R_2$ is an alkyl or a substituted alkyl;

$R_3$ is an alkyl with at least one hydrogen at the $C_1$ position, or is taken together with $R_2$ to form an alicyclic moiety; and $R_4$ is —OH, —$OXR_5$ or

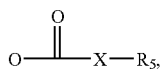

wherein X is a straight or branched alkyl and $R_5$ is selected from the group consisting of carboxylic acids and fluoroalcohol moieties. Preferably, $R_2$ is a lower alkyl; and $R_3$ is a lower alkyl.

Examples of suitable monomers of formula (I) include:

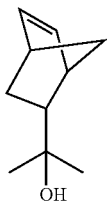
(Ia)

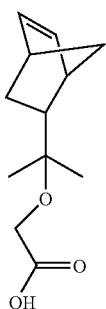
(Ib)

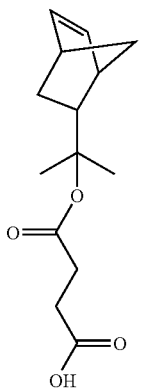
(Ic)

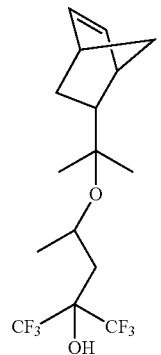
(Id)

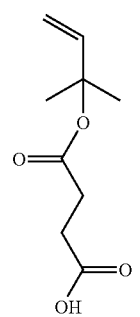
(Ie)

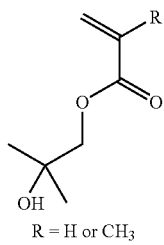
(If)

R = H or $CH_3$

The proposed mechanism of acid catalyzed elimination of polar functional groups for polymers containing monomers of formula (I) is, for example, depicted in Scheme I:

Scheme I

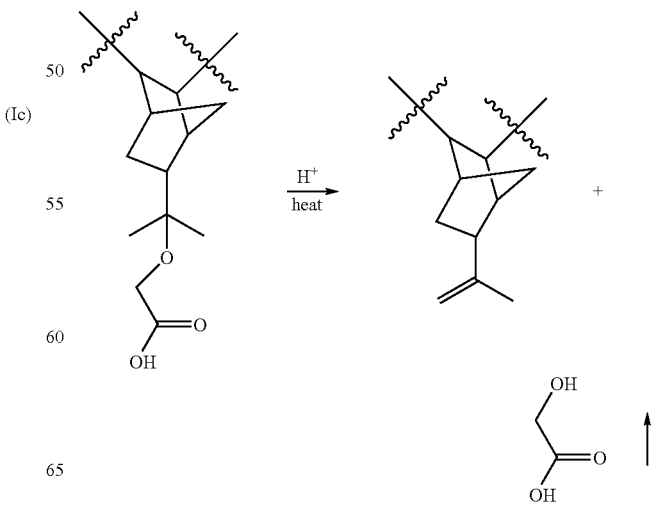

-continued

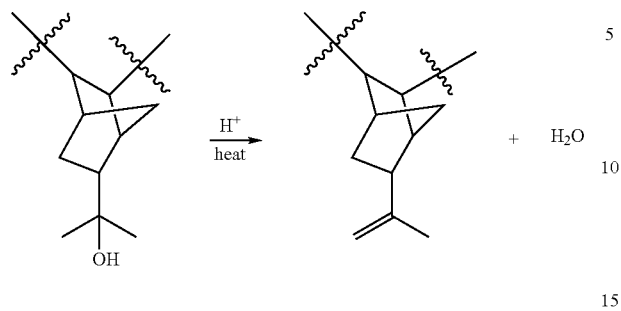

wherein the eliminated polar functional group evaporates upon heating, and the resulting polymer is aqueous base insoluble.

In another embodiment of the invention, the first monomer has a polar functional group ($R_9$) that is attached to the polymer backbone via an acetal (where $R_8$ is hydrogen) or ketal (where $R_8$ is an alkyl) linkage. This monomer is depicted in formula (II).

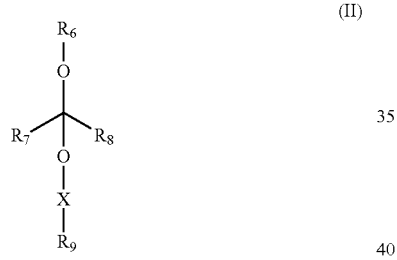

(II)

wherein:

$R_6$ is a polymerizable group selected from the group consisting of acrylate, methacrylate, cyclic olefin, and vinyl moieties;

$R_7$ is selected from the group consisting of hydrogen, alkyls, and substituted alkyls;

$R_8$ is selected from the group consisting of hydrogen, alkyls, fluoroalcohol moieties, and carboxylic acids;

X is a straight or branched alkyl, or is taken together with $R_7$ to form an alicyclic moiety; and $R_9$ is selected from the group consisting of hydrogen, alkyls, fluoroalcohol moieties, carboxylic acids, provided that one of $R_8$ or $R_9$ is a fluoroalcohol moiety or carboxylic acid. Preferably, $R_6$ is a methacrylate or cyclic olefin moiety; $R_7$ is a lower alkyl; $R_8$ is hydrogen; X is a straight alkyl, or is taken together with $R_7$ to form an alicyclic moiety; and $R_9$ is a fluoroalcohol moiety or carboxylic acid.

Examples of suitable monomers of formula (II) include:

(IIa)

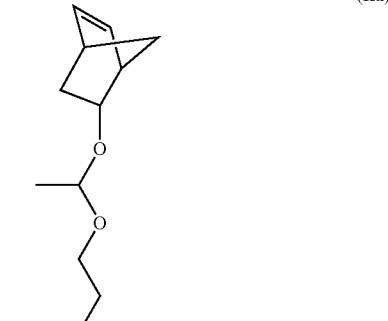
(IIb)

R = H or $CH_3$

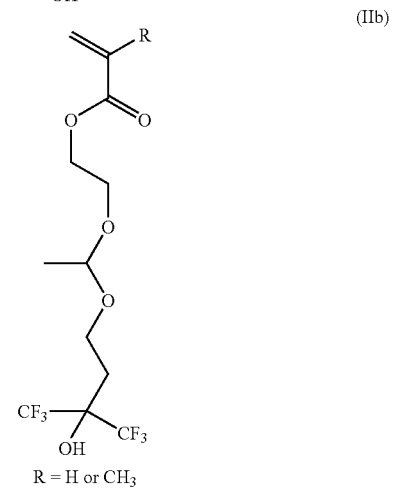
(IIc)

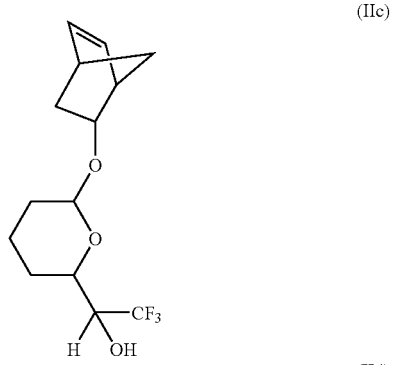
(IId)

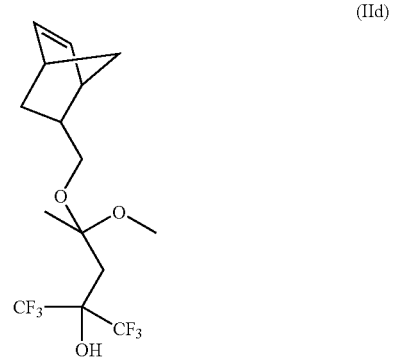

The proposed mechanism of acid catalyzed elimination of polar functional groups for polymers containing monomers of formula (II) is, for example, depicted in Scheme II:

Scheme II

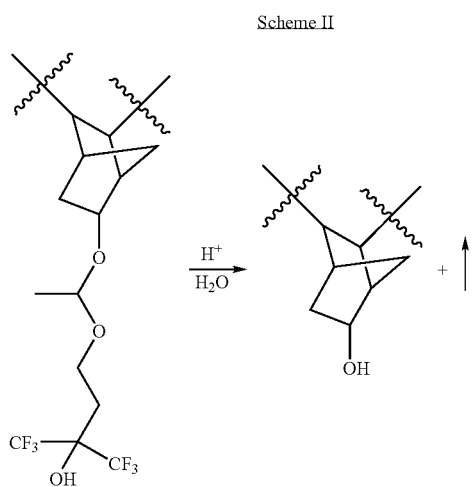

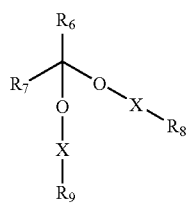

wherein the eliminated polar functional groups evaporate upon heating, and the resulting polymer is aqueous base insoluble.

A variation of the monomer of formula (II) is formula (II'):

(II')

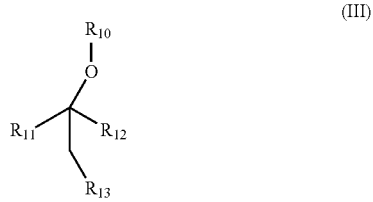

wherein $R_6$, $R_7$, X, $R_8$, and $R_9$ are defined as for formula (II). An example of a suitable monomer of formula (II') includes:

(II'a)

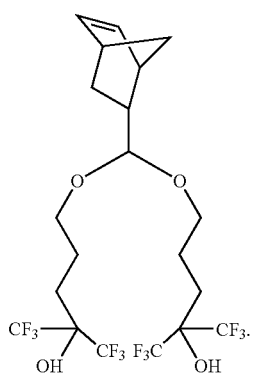

In another embodiment of the invention, the first monomer has a polar functional group ($R_{13}$) that is attached to the polymer backbone as a tertiary ether. This monomer is depicted in formula (III).

(III)

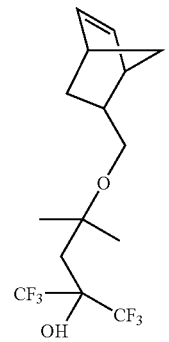

wherein:

$R_{10}$ is a polymerizable group selected from the group consisting of acrylate, methacrylate, cyclic olefin, and vinyl moieties;

$R_{11}$ is an alkyl;

$R_{12}$ is an alkyl with at least one hydrogen at the C1 position, or is taken together with $R_{11}$ to form an alicyclic moiety; and $R_{13}$ is a fluoroalcohol moiety or carboxylic acid. Preferably, $R_{10}$ is a cyclic olefin or vinyl moiety.

Examples of suitable monomers of formula (III) include:

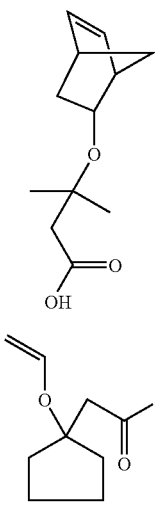

The proposed mechanism of acid catalyzed elimination of polar molecules for polymers containing monomers of formula (III) is, for example, depicted in Scheme III:

Scheme III

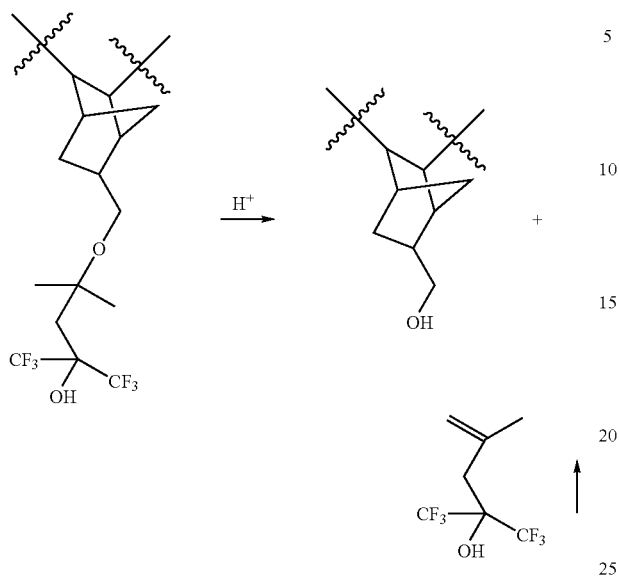

wherein the eliminated polar functional groups evaporate upon heating, and the resulting polymer is aqueous base insoluble.

In addition to the above first monomers, the polymers useful in the present negative resist compositions comprise a second monomer, which enhances the dissolution properties of the polymer. Preferred second monomers include fluoroalcohol (e.g., —C(CF$_3$)$_2$OH or —CH(CF$_3$)OH), carboxylic acid (e.g., methacrylic acid), lactone, anhydride and sulfonamide moieties. The second monomer includes compounds of the following structures (IV-XI):

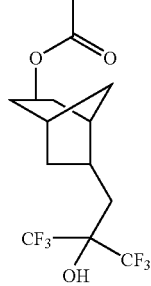

(IV)

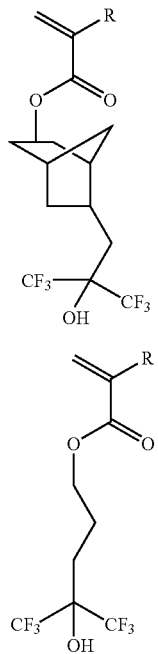

(V)

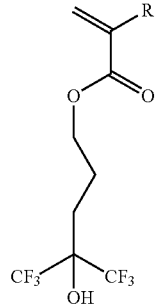

(VI)

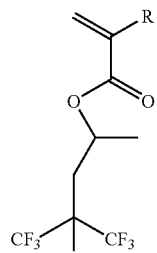

(VII)

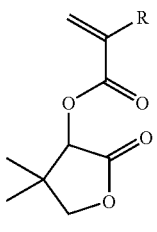

(VIII)

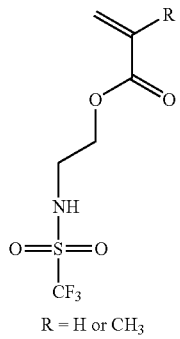

R = H or CH$_3$ (IX)

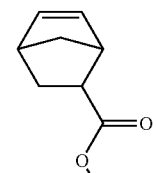

(X)

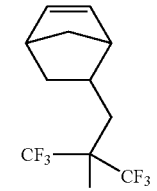

(XI)

Structure (IX), having never been previously reported for use in resist compositions, is of particular interest.

Polymers of the invention may also comprise a third monomer that imparts at least one characteristic selected from crosslinkable functionality, etch resistance, and solubility modulation. Preferably, the third monomer contains a primary alcohol moiety. Suitable third monomers include compounds of the following structures (XII-XIV):

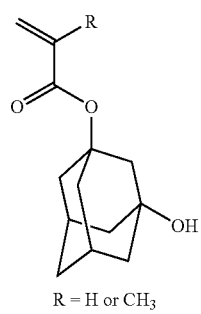

(XII)

R = H or CH₃

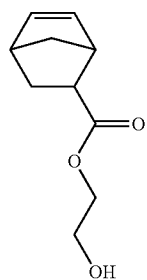

(XIII)

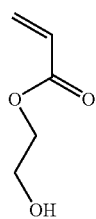

(XIV)

Such monomers are used in polymers of negative resist compositions, so as to provide variable crosslinking, etch resistance, and solubility modulation properties that may be altered for different applications.

Polymers of the invention comprising a first monomer, a second monomer, and optionally a third monomer, as described above, include block copolymers, block terpolymers, random copolymers, and random terpolymers. In a preferred embodiment, the polymers of the invention comprise a first monomer having a polar functional group; a second monomer having a fluoroalcohol moiety; and optionally a third monomer. In this embodiment, preferably the polar functional group is selected from the group consisting of alcohol moieties, fluoroalcohol moieties, and carboxylic acids. In another preferred embodiment, the polymer of the invention comprises a first monomer having a polar functional group selected from the group consisting of fluoroalcohol moieties, and carboxylic acids; a second monomer; and optionally a third monomer. In this embodiment, preferably the second monomer contains a fluoroalcohol, carboxylic acid, lactone, anhydride or sulfonamide moiety.

Examples of polymers of the present invention are presented below as structures (XV-XX).

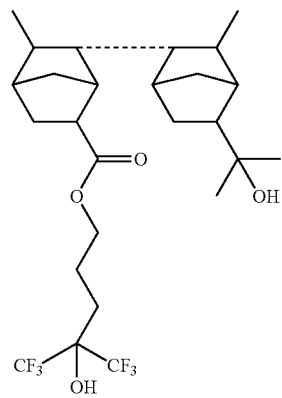

(XV)

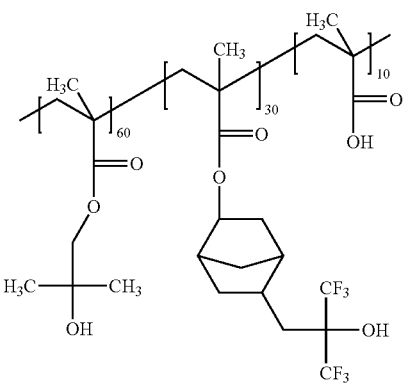

(XVI)

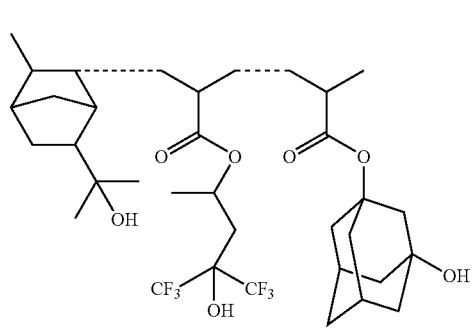

(XVII)

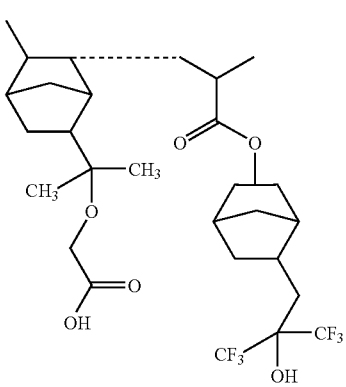

(XVIII)

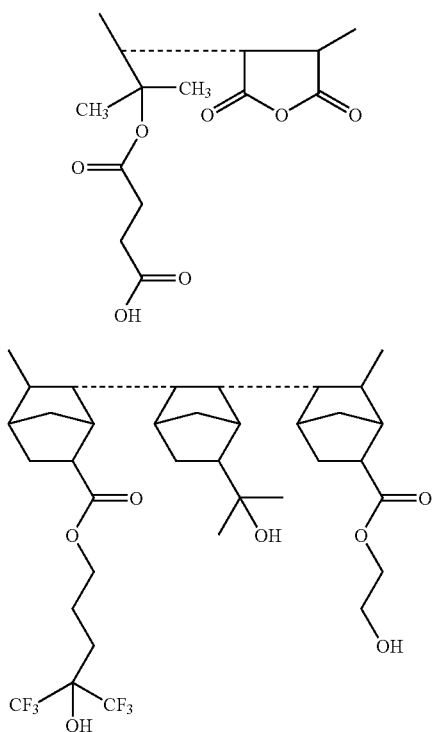

(XIX)

(XX)

III. Negative Resist Compositions

In addition to the polymers described above, the resist compositions can further include photoacid generators, crosslinking agents, basic compounds (e.g., stabilizers and acid diffusion controlling additives), solvents, dissolution accelerators, photobase generators, latent basic compounds, surfactants, adhesion promoters, and anti-foaming agents. The dissolution accelerators, photobase generators, acid or base additives, employed in the resists of the invention may be selected from conventional compounds that are well known to those skilled in the art; therefore a detailed description of those components is not given herein.

Suitable photoacid generators are compounds that, upon exposure to radiation, generate a strong acid and are compatible with the other components of the photoresist composition. Examples of suitable photoacid generators (PAGs) include, but are not limited to, α-(trifluoromethylsulfonyloxy) -bicyclo[2.2.1]hept-5-ene-2,3-dicarboximide (MDT), onium salts, aromatic diazonium salts, sulfonium salts, diaryliodonium salts and sulfonic acid esters of N-hydroxyamides or N-hydroxyimides, as disclosed in U.S. Pat. No. 6,200,726 to Chen et al. Also, a PAG that produces a weaker acid such as the dodecane sulfonate of N-hydroxy-naphthalimide (DDSN) may be used. Combinations of PAGs may also be used. Generally, suitable acid generators have high thermal stability (are preferably stable to temperatures greater than 140° C.) so they are not degraded during pre-exposure processing. In addition to MDT and DDSN, suitable sulfonate compounds are sulfonate salts, but other suitable sulfonate PAGs include sulfonated esters and sulfonyloxy ketones. See U.S. Pat. No. 5,344,742 to Sinta et al., and *J. Photopolym. Sci. and Tech.,* 4:337 (1991), for examples of other suitable sulfonate PAGs, including benzoin tosylate, t-butylphenyl-α-(p-toluenesulfonyloxy)-acetate and t-butyl-α-(p-toluenesulfonyloxy)-acetate. Onium salts that contain weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts and sulfoxonium salts or selenium salts, (e.g., triarylsulfonium and diaryliodonium hexafluoroantimonates, hexafluoroarsenates, trifluoromethanesulfonates and others). One preferred diaryliodonium salt is iodonium perfluorooctanesulfonate (U.S. Pat. No. 6,165,673 to Breyta et al.). Examples of other suitable onium salts can be found in U.S. Pat. No. 4,442,197 to Crivello et al., U.S. Pat No. 4,603,101 to Crivello, and U.S. Pat. No. 4,624,912 to Zweifel et al. Other useful acid generators include the family of nitrobenzyl esters, and the s-triazine derivatives. Suitable s-triazine acid generators are disclosed, for example, in U.S. Pat. No. 4,189,323 to Buhr.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl) iodonium camphanylsulfonate, perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, α,α'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

The crosslinking agent used in the resist compositions provided herein may be any suitable crosslinking agent known in the negative resist art which is otherwise compatible with the other selected components of the resist composition. The crosslinking agents preferably act to crosslink the polymer component in the presence of a generated acid. Suitable crosslinking agents include glycoluril compounds such as tetramethoxymethyl glycoluril, methylpropyltetramethoxymethyl glycoluril, and methylphenyltetramethoxymethyl glycoluril (POWDERLINK®, available from American Cyanamid Company). Other exemplary crosslinking agents include 2,6-bis(hydroxymethyl)-p-cresol and analogs and derivatives thereof, such as those found in Japanese Laid-Open Patent Application (Kokai) No. 1-293339, as well as etherified amino resins, for example methylated or butylated melamine resins (N-methoxymethyl-or N-butoxymethyl-melamine respectively) or methylated/butylated glycolurils, for example as can be found in Canadian Patent No. 1 204 547. Combinations of any of these crosslinking agents may also be used.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

The choice of solvent is governed by many factors including the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., Introduction to Microlithography, Eds. Thompson et al., cited previously. In addition to the above components, the photoresist compositions provided herein generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise the unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and poly-ethyleneglycol ethers, cycloaliphatic esters, and non-acid reactive steroidally-derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

IV. Use in Generation of Negative Resist Images on A Substrate

The present invention also relates to a process for generating a negative resist image on a substrate comprising the steps of: (a) coating a substrate with a film comprising a negative resist composition provided herein; (b) exposing the film selectively to a predetermined pattern of radiation so as to form a latent, patterned image in the film; and (c) developing the latent image with a standard developer. The first step involves coating the substrate with a film comprising the resist composition dissolved in a suitable solvent. Suitable substrates are ceramic, metallic or semiconductive, and preferred substrates are silicon-containing, including, for example, silicon dioxide, silicon nitride, and silicon oxynitride. The substrate may or may not be coated with an organic anti-reflective layer prior to deposition of the resist composition. Alternatively, a bilayer resist may be employed wherein a resist composition provided herein forms an upper resist layer (i.e., the imaging layer), and the underlayer is comprised of a material that is highly absorbing at the imaging wavelength and compatible with the imaging layer. Conventional underlayers include diazonaphthoquinone (DNQ)/novolak resist material.

Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90-150° C. for a short period of time, typically on the order of about 1 minute. The dried film has a thickness of about 0.02-5.0 microns, preferably about 0.05-2.5 microns, most preferably about 0.10 to 1.0 microns.

The radiation may be ultraviolet, electron beam or x-ray. Ultraviolet radiation is preferred, particularly deep ultraviolet radiation having a wavelength of less than about 250 nm, e.g., 157 nm using an $F_2$ excimer laser. The radiation is absorbed by the radiation-sensitive acid generator to generate free acid, which, upon heating (generally to a temperature of about 90-150° C. for a short period of time, on the order of about 1 minute), causes cleavage of the polar groups.

The third step involves development of the image with a suitable solvent. Suitable solvents include an aqueous base, preferably an aqueous base without metal ions such as the industry standard developer tetramethylammonium hydroxide or choline. Other solvents may include organic solvents or carbon dioxide (in the liquid or supercritical state), as disclosed in U.S. Pat. No. 6,665,527 to Allen et al. Because the copolymer of the resist composition is substantially transparent at 157 nm, the resist composition is uniquely suitable for use at that wavelength as well as 193 nm. However, the resist may also be used with wavelengths of 248 nm or with EUV (e.g., at 13 nm) electron beam or x-ray radiation.

The pattern from the resist structure may then be transferred to the material of the underlying substrate. Typically, the transfer is achieved by reactive ion etching or some other etching technique. Thus, the compositions provided herein and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. Accordingly, the processes for making these features involves, after development with a suitable developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. In the manufacture of integrated circuits, circuit patterns can be formed in the exposed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. Examples of such processes are disclosed in U.S. Pat. No. 4,855,017 to Douglas; U.S. Pat. No. 5,362,663 to Bronner et al.; U.S. Pat. No. 5,429,710 to Akiba et al.; U.S. Pat No. 5,562,801 to Nulty; U.S. Pat. No. 5,618,751 to Golden et al.; U.S. Pat. No. 5,744,376 to Chan et al.; U.S. Pat No. 5,801,094 to Yew et al.; and U.S. Pat. No. 5,821,469 to Shanmugham. Other examples of pattern transfer processes are described in Chapters 12 and 13 of Moreau, *Semiconductor Lithography, Principles, Practices, and Materials* (Plenum Press, 1988). However, it should be understood that the invention is not limited to any specific lithographic technique or device structure.

It is also to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXPERIMENTAL

In the following examples, efforts have been made to ensure accuracy with respect to numbers used but some experimental error and deviation should be accounted for. All materials were obtained commercially from Sigma-Aldrich unless otherwise indicated.

Example 1

Glycolic acid 2-(5-norbornen-2-yl)-2-propyl ether (Ib)

2-(5-norbornen-2-yl)-2-propanol (15.20 g, 0.10 mole) (JSR Corp., Japan) and toluene (100 ml) were added to a three-necked 500 ml round bottomed flask equipped with a magnetic stirrer, an addition funnel, and a condenser with a nitrogen inlet. The addition funnel was charged with n-butyl lithium (1.6M in hexane, 62.50 ml, 0.10 mole). The n-butyl lithium was added drop wise while stirring at room temperature. An exothermic reaction occurred. Afterwards, chloroacetic acid (4.75 g, 0.05 mole) in toluene (100 ml) was added drop wise. The contents were heated to reflux for about 20 hours. After cooling to room temperature, water (200 ml) was added cautiously and stirred. The water phase was collected, washed with ether (100 ml) and neutralized with 2 molar hydrochloric acid solution. The cloudy solution was extracted twice with ether (100 ml) and the combined ether solutions was washed with brine (100 ml) and dried over anhydrous magnesium sulfate. The solvent was removed and the residue was recrystallized from a small amount of hexane to give 3.3 g of white crystalline material (Melting Point: 48.5-49.50° C).

Example 2

Mono(2-Vinyl-2-propyl) succinate (Ie)

This compound was synthesized according to the procedure in Gazzo et. al. (1994) *Journal of Organic Chemistry*, 159:17.

A mixture of succinic anhydride (60.00 g, 0.60 mole), 2-methyl-3-buten-2-ol (155.10 g, 1.80 mole), N-hydroxysuccinimide (20.00 g, 0.18 mole), 4-(dimethylamino)pyridine (7.0 g, 0.06 mole) and triethylamine (25 ml, 0.18 mole) in toluene (200 ml) was heated to reflux under nitrogen for about 18 hours in a 500 ml round bottomed flask equipped with a condenser and a magnetic stir bar. After cooling to room temperature, the solution was diluted with ethyl acetate (200 ml). This solution was washed with citric acid (3×200 ml) solution and dried over anhydrous magnesium sulfate. Afterwards, the solvent was removed on a rotary evaporator.

The crude product was then stirred with ammonium hydroxide (0.64 mole) in deionized water (160 ml). The resulting aqueous solution was washed twice with ether (100 ml) and neutralized with 3.0 molar hydrochloric acid. The cloudy solution was extracted with ether (200 ml) and the ether solution was washed with brine (100 ml) and dried over anhydrous magnesium sulfate. Afterwards, solvent was removed on a rotary evaporator and the residue was dried under vacuum to give 49.66 g of the product as a viscous liquid.

Example 3

2-hydroxy-2,2-dimethylethyl methacrylate (If) ($R=CH_3$)

A mixture of 1-chloromethyl-2-methyl-2-propanol (21.80 g, 0.20 mole), sodium methacrylate (32.40 g, 0.30 mole), Adogen 464 (7.00 g, 0.015 mole) (phase transfer catalyst purchased from Aldrich Chemical Co.), and phenothiazine (60 mg) in butyronitrile (200 ml) was heated to reflux under nitrogen in a three-necked round bottomed flask equipped with a condenser and a mechanical stirrer. After cooling the contents to room temperature, the mixture was diluted with hexane (200 ml) and filtered through celite. The solvents were removed under aspirator vacuum (40-80° C.). The residue was distilled under high vacuum. The 22.50 grams of the product was collected between 72-80° C. at 2 mm pressure as a clear liquid.

Example 4

1,1,1-trifluoro-2-hydroxy-2-trifluoromethyl-4-pentyl norbornene-5-carboxylate (IX)

4a) Synthesis of norbornene-5-carbonylchloride:

A 1-L, three-neck round-bottom flask equipped with a magnetic stirrer, digital thermometer, glass stopper, an addition funnel with a nitrogen gas purge, and a dry-ice cooling bath was charged with freshly distilled cyclopentadiene (248 g, 3.75 mol), which was cooled to 0° C. The addition funnel was charged with freshly distilled acryloyl chloride (317 g, 3.5 mol), which was added drop wise to the reaction over about three hours while maintaining the reaction temperature between 0-10° C. After the acryloyl chloride addition was complete, the cooling bath was removed and the reaction allowed to warm to room temperature overnight. The reaction mixture was distilled under vacuum, collecting 533 g of the title product distilling at 54-56° C. at a pressure of 300 milliTorr.

4b) Preparation of 1,1,1-trifluoro-2-trifluoromethyl-2,5-pentanediol and 1,1,1-trifluoro-2-trifluoromethy-2,4-pentanediol:

Borane-dimethylsulfide complex (974 ml, 1.95 mol) (2.0 M in THF), was added to a three-necked, 3-L round bottomed flask equipped with an overhead stirrer, a digital thermometer and a 1-L constant-pressure addition funnel with a nitrogen inlet. The addition funnel was charged with a solution of 1,1,1-trifluoro-2-trifluoromethyl-4-penten-2-ol (353 g, 1.7 mol) (Central Glass, Japan) in anhydrous THF (400 ml). The flask was cooled and the olefin was added slowly with stirring, while maintaining a temperature below about 15° C. The mixture was stirred at room temperature for about two days, after which time, it was recooled and 3M NaOH (aq) (750 ml, 2.25 mol) was added carefully. The reaction mixture was reduced in volume on a rotary evaporator and subsequently co-evaporated with two portions of diethylether (500 ml). The resulting oil was taken up in THF (300 mL) and the solution was transferred to a 1-L three-necked round bottomed flask equipped with a 250-mL addition funnel, a digital thermometer and a magnetic stir bar. The addition funnel was charged with 30% hydrogen peroxide (250 ml). The flask was cooled and the hydrogen peroxide was added slowly with stirring. After stirring overnight at room temperature, the solution was diluted with diethylether (1L) and adjusted to pH 6 (wet litmus) with 5% HCl. The ether layer was separated and the aqueous layer was extracted with ether (2×500 ml). The combined organic phases were washed with saturated ammonium chloride and brine (2×500 ml), dried over $MgSO_4$ and evaporated to a crude yield of 379 g of a mixture of the two possible alcohols. The diols were separated by distillation through a 12" Vigreux, boiling point of 47° C. at 1.0 mm Hg (2° alcohol) and boiling point of 55° C. at 1.0 mm Hg (1° alcohol). The 1° alcohol is a viscous oil.

4c) Preparation of 1,1,1-trifluoro-2-hydroxy-2-trifluoromethyl-4-pentyl norbornene-5-carboxylate:

N-butyllithium (1600 ml) (2.56 mol, 1.6M solution in hexanes) was added to a 3-L, three-necked round bottomed flask equipped with an overhead stirrer, a digital thermometer, a 500-mL capacity constant-pressure dropping funnel and a nitrogen inlet. The dropping funnel was charged with a solution of 1,1,1-trifluoro-2-trifluoromethyl-2,4-pentanediol (289 g, 1.28 mol) in anhydrous THF (250 ml). The flask was cooled in ice and the THF solution was slowly added over about 2 hours, while maintaining a temperature below 100 C. Once the addition was complete, the dropping funnel was recharged with a solution of norbornene-5-carbonylchloride (201 g, 1.28 mol) in anhydrous THF (250 ml), which was then slowly added over about 1.5 hours, while maintaining a temperature below 10° C. The solution was allowed to reach room temperature with stirring overnight. The resulting suspension was transferred to a 4-L separatory funnel and washed once with water (1 L). The organic layer was separated and the aqueous wash was adjusted to pH 6 (litmus) with concentrated HCl and extracted twice with ether (1 L). The combined organic solutions were washed once with water and once with brine and dried over anhydrous magnesium sulfate. The suspension was filtered, the solvent removed on a rotary evaporator and the resulting oil distilled twice at 1200 C. and 0.5 mm Hg to yield 387 g of the title compound as an oil.

Example 5

Polymer (XV): Poly[1,1,1-trifluoro-2-hydroxy-2-trifluoromethyl-4-pentyl norbornene-5-carboxylate-co-2-(5-norbornen-2-yl)-2-propanol Polymer (XV), combining monomers (Ia) and (IX), was synthesized by Promerus LLC using a nickel catalyst mediated polymer. This type of synthesis was reported previously in U.S. Pat. No. 6,455,650 to Lipian et al.

Example 6

Polymer (XVII): Poly[2-(5-norbornen-2-yl)-2-propanol-co-1,1,1-trifluoro-2-trifluoromethyl-2-hydroxy-4-pentyl acrylate-co-3-hydroxy-1-adamantylacrylate]

Polymer (XVII) combines the monomers (Ia), (VI) (R=H), and (XII) (R=H).

2-(5-norbomen-2-yl)-2-propanol (Ia) (JSR Corp., Japan) (2.28 g, 0.015 mole), 1,1,1-trifluoro -2-trifluoromethyl-2-hydroxy-4-pentyl acrylate (VI) (R=H) (3.36 g, 0.012 mole) (synthesis described in U.S. Pat. No. 6,660,625 to Lee et al.), 3-hydroxy -1-adamantylacrylate (XII) (R=H) (0.67 g, 0.003 mole) (JSR Corp., Japan) and ethyl acetate (6.3 g) were placed in a round bottom flask equipped with a condenser, magnetic stirrer, and nitrogen inlet. 2,2'-Azoisobutyronitnle (AIBN) (0.20 g, 0.0012 mole) was added to this solution and stirred until dissolved. Then, the solution was degassed using four vacuum/nitrogen purges. The contents were then heated to reflux for about 18 hours. Afterwards, the solution was added drop wise into hexanes (500 ml). The precipitated polymer was filtered, washed twice with hexanes (50 ml) and dried under vacuum at 60° C.

Example 7

Polymer (XVIII): Poly[Glycolic acid 2-(5-norbornen-2-yl)-2-propyl ether-co-2-{[5-(1',1',1'-trifluoro-2'-trifluoromethyl-2'-hydroxy)propyl]norbornyl}acrylate]

Polymer (XVIII) combines the monomers (Ib) and (IV) (R=H).

Glycolic acid 2-(5-norbomen-2-yl)-2-propyl ether (Ib) (2.10 g, 0.01 mole), and 2-{[5(1',1',1'-trifluoro-2'-trifluoromethyl-2'-hydroxy)propyl norbornyl} acrylate (IV) (R=H)] (3,46 g, 0.01 mole) (synthesis described in U.S. Pat. No. 6,660,625 to Lee et al.) and ethyl acetate (6.0 g) were placed in a round bottom flask equipped with a condenser, magnetic stirrer, and nitrogen inlet. AIBN (0.13 g, 0.0008 mole) was added to this solution and stirred until dissolved. Then, the solution was degassed using four vacuum/nitrogen purges. The contents were then heated to reflux for about 18 hours. Afterwards, the solution was added drop wise into hexanes (800 ml). The precipitated polymer was filtered, washed twice with hexanes (50 ml) and dried under vacuum at 60° C.

Example 8

Negative Resist Formulation

Polymer (1 g) and di(t-butyl)phenyl iodonium perfluorobutane sulfonate (40 mg) are dissolved in propylene glycol monomethyl ether acetate (8 g) and filtered through a 0.20 micron syringe filter. In addition, cross-linking agent (Example: POWDERLINK, American Cynamid Company), bases, and a surfactant are added, as needed, to enhance the performance.

We claim:

1. A polymer useful in negative resist compositions, comprising:

a first monomer having a polar functional group that is attached as a tertiary ether linkage, a tertiary ester linkage, or an acetal linkage, wherein the first monomer provides an acid catalyzed polarity switch upon elimination of the polar functional group; and a second monomer having a fluoroalcohol moiety, wherein the second monomer provides aqueous dissolution, wherein the first monomer has the structure of formula (I):

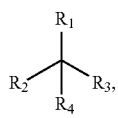

(I)

wherein:

$R_1$ is a polymerizable group selected from the group consisting of acrylate, methacrylate, cyclic olefin, and vinyl moieties;

$R_2$ is an alkyl, or a substituted alkyl;

$R_3$ is an alkyl, with at least one hydrogen at the C1 position, or is taken together with $R_2$ to form an alicyclic moiety; and $R_4$ is —$OXR_5$, or

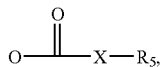

wherein X is a straight or branched alkyl group and $R_5$ is selected from the group consisting of carboxylic acids and fluoroalcohol moieties.

2. The polymer of claim 1, wherein the polar functional group is a moiety selected from alcohol, carboxylic acid, and fluoroalcohol moieties.

3. The polymer of claim 1, wherein $R_2$ is a lower alkyl; and $R_3$ is a lower alkyl.

4. The polymer of claim 3, wherein the first monomer is selected from the group consisting of

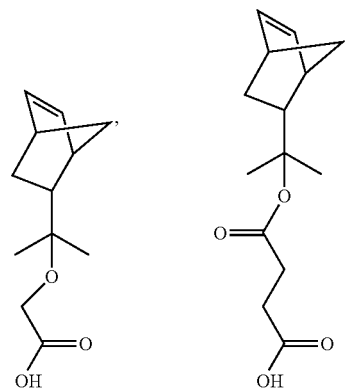

, and

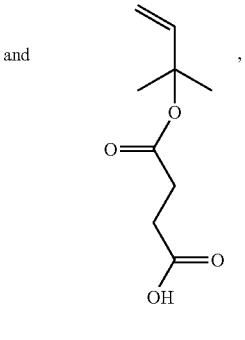

wherein:
R is hydrogen or $CH_3$.

5. The polymer useful in negative resist compositions, comprising:

a first monomer having a polar functional group that is attached as a tertiary ether linkage, a tertiary ester linkage, or an acetal linkage, wherein the first monomer provides an acid catalyzed polarity switch upon elimination of the polar functional group; and a second monomer having a fluoroalcohol moiety wherein the second monomer provides aqueous dissolution, wherein the first monomer has the structure of formula (II):

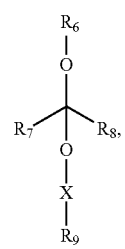

(II)

wherein:

$R_6$ is a polymerizable group selected from the group consisting of acrylate, methacrylate, cyclic olefin, and vinyl moieties;

$R_7$ is selected from the group consisting of hydrogen, alkyls, and substituted alkyls;

$R_8$ is selected from the group consisting of hydrogen, alkyls, fluoroalcohol moieties, and carboxylic acids;

X is a straight or branched alkyl group, or is taken together with $R_7$ to form an alicyclic moiety; and $R_9$ is selected from the group consisting of hydrogen, alkyls, fluoroalcohol moieties, carboxylic acids, provided that one of $R_8$ or $R_9$ is a fluoroalcohol moiety or carboxylic acid.

6. The polymer of claim 5, wherein $R_6$ is a methacrylate or cyclic olefin moiety; $R_7$ is a lower alkyl; $R_8$ is hydrogen; X is a straight alkyl, or is taken together with $R_7$ to form an alicyclic moiety; and $R_9$ is a fluoroalcohol moiety or carboxylic acid.

7. The polymer of claim 6, wherein the first monomer is selected from the group consisting of

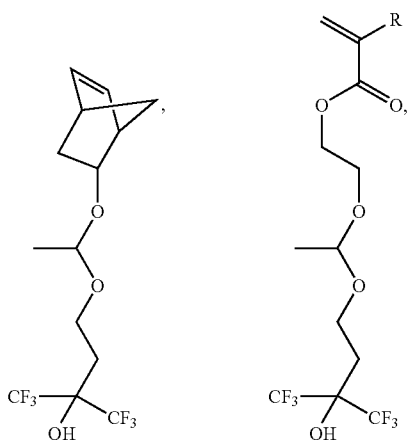

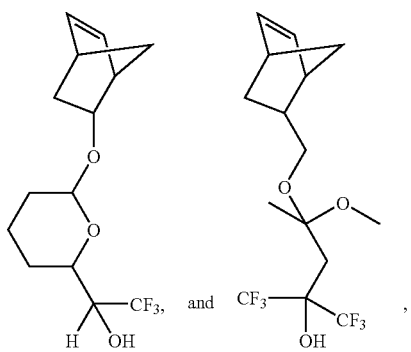

wherein:

R is hydrogen or $CH_3$.

8. The polymer of claim 5, wherein the first monomer of formula (II) has the structure of formula (II'):

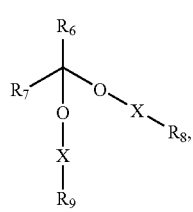

wherein $R_6$, $R_7$, X, $R_8$, and $R_9$ are defined as for formula (II).

9. The polymer of claim 8, wherein the first monomer is:

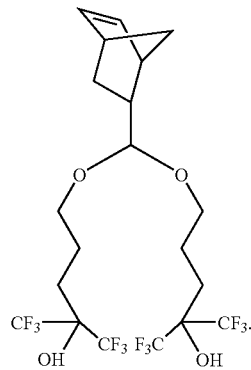

10. A polymer useful in negative resist compositions, comprising:

a first monomer having a polar functional group that is attached as a tertiary ether linkage, a tertiary ester linkage, or an acetal linkage wherein the first monomer provides an acid catalyzed polarity switch upon elimination of the polar functional group; and a second monomer having a fluoroalcohol moiety, wherein the second monomer provides aqueous dissolution, wherein the first monomer has the structure of formula (III):

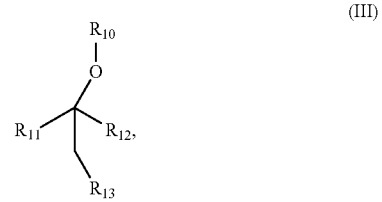

(III)

wherein:

$R_{10}$ is a polymerizable group selected from the group consisting of acrylate, methacrylate, cyclic olefin, and vinyl moieties;

$R_{11}$ is an alkyl;

$R_{12}$ is an alkyl with at least one hydrogen at the C1 position, or is taken together with $R_{11}$ to form an alicyclic moiety; and $R_{13}$ is a fluoroalcohol moiety or carboxylic acid.

11. The polymer of claim 10, wherein $R_{10}$ is a cyclic olefin or vinyl moiety.

12. The polymer of claim 11, wherein the first monomer is selected from the group consisting of

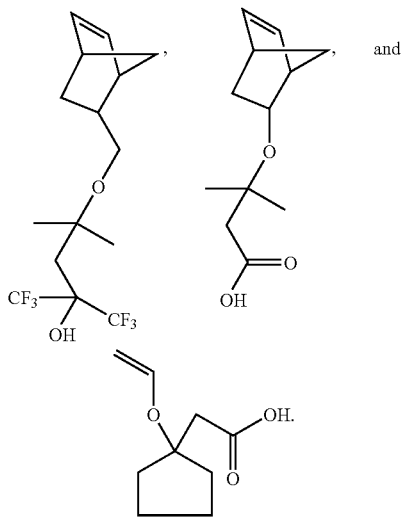

13. The polymer of any one claims 1, 5, and 10, further comprising a third monomer that imparts at least one characteristic selected from crosslinkable functionality, etch resistance, and solubility modulation.

14. The polymer of claim 13, wherein the third monomer has a primary alcohol moiety.

15. The polymer of claim 13, wherein the polymer is a block copolymer.

16. The polymer of claim 13, wherein the polymer is a random copolymer.

17. The polymer of any one of claims 1, 5, and 10, wherein the second monomer is selected from the group consisting of

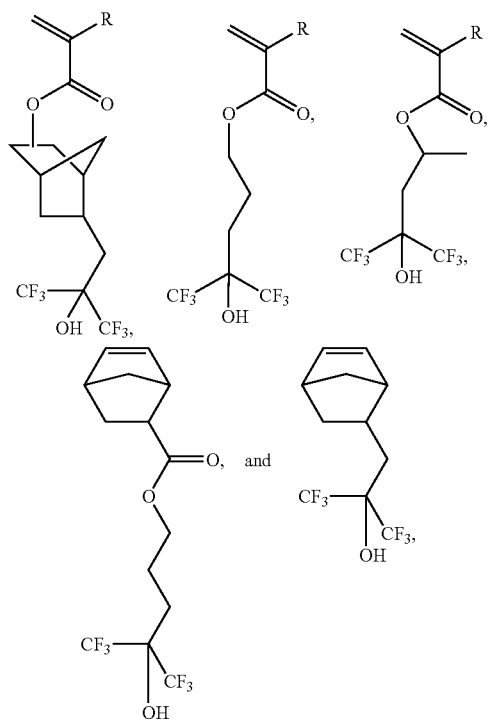

wherein:

R is hydrogen or $CH_3$.

18. The polymer of claim 17, wherein the second monomer has the following structure:

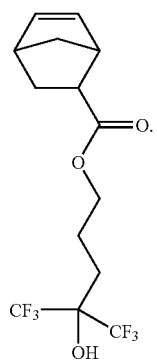

19. The polymer of any one of claims 1, 5, and 10, wherein the polymer is a block copolymer.

20. The polymer of any one of claims 1, 5, and 10, wherein the polymer is a random copolymer.

21. A polymer useful in negative resist compositions, comprising:

a first monomer having a polar functional group selected from the group consisting of fluoroalcohol moieties and carboxylic acids, wherein the first monomer is attached as a tertiary ether linkage, a tertiary ester linkage, or an acetal linkage and provides an acid catalyzed polarity switch upon elimination of the polar functional group; and a second monomer, wherein the second monomer provides aqueous dissolution, wherein the first monomer has the structure of formula (I):

(I)

wherein:

$R_1$ is a polymerizable group selected from the group consisting of acrylate, methacrylate, cyclic olefin, and vinyl moieties;

$R_2$ is an alkyl, or a substituted alkyl;

$R_3$ is an alkyl with at least one hydrogen at the C1 position, or is taken together with $R_2$ to form an alicyclic moiety; and $R_4$ is $-OXR_5$ or

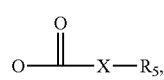

wherein X is a straight or branched alkyl group and $R_5$ is selected from the group consisting of carboxylic acids and fluoroalcohol moieties.

22. A polymer useful in negative resist compositions, comprising:
   a first monomer having a polar functional group selected from the group consisting of fluoroalcohol moieties and carboxylic acids, wherein the first monomer is attached as a tertiary ether linkage, a tertiary ester linkage, or an acetal linkage and provides an acid catalyzed polarity switch upon elimination of the polar functional group; and
   a second monomer, wherein the second monomer provides aqueous dissolution,
   wherein the first monomer has the structure of formula (II):

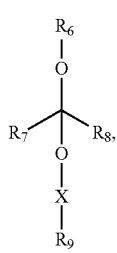

(II)

wherein:
   $R_6$ is a polymerizable group selected from the group consisting of acrylate, methacrylate, cyclic olefin, and vinyl moieties;
   $R_7$ is selected from the group consisting of hydrogen, alkyls, and substituted alkyls;
   $R_8$ is selected from the group consisting of hydrogen, alkyls, fluoroalcohol moieties, and carboxylic acids;
   X is a straight or branched alkyl group, or is taken together with $R_7$ to form an alicyclic moiety; and
   $R_9$ is selected from the group consisting of hydrogen, alkyls, fluoroalcohol moieties, carboxylic acids, provided that one of $R_8$ or $R_9$ is a fluoroalcohol moiety or carboxylic acid.

23. A polymer useful in negative resist compositions, comprising:
   a first monomer having a polar functional group selected from the group consisting of fluoroalcohol moieties and carboxylic acids, wherein the first monomer is attached as a tertiary ether linkage, a tertiary ester linkage, or an acetal linkage and provides an acid catalyzed polarity switch upon elimination of the polar functional group; and
   a second monomer, wherein the second monomer provides aqueous dissolution,
   wherein the first monomer has the structure of formula (III):

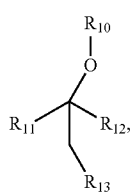

(III)

wherein:
   $R_{10}$ is a polymerizable group selected from the group consisting of acrylate, methacrylate, cyclic olefin, and vinyl moieties;
   $R_{11}$ is an alkyl
   $R_{12}$ is an alkyl with at least one hydrogen at the C1 position, or is taken together with $R_{11}$ to form an alicyclic moiety; and
   $R_{13}$ is a fluoroalcohol moiety or carboxylic acid.

24. The polymer of any one of claims 21, 22, and 23, further comprising a third monomer that imparts at least one characteristic selected from crosslinkable functionality, etch resistance, and solubility modulation.

25. The polymer of claim 24, wherein the third monomer has a primary alcohol moiety.

26. The polymer of any one of claims 21, 22, and 23, wherein the second monomer has a moiety selected from the group consisting of fluoroalcohol, carboxylic acid, lactone, sulfonamide and anhydride moieties.

27. The polymer of claim 22, wherein the second monomer is selected from the group consisting of

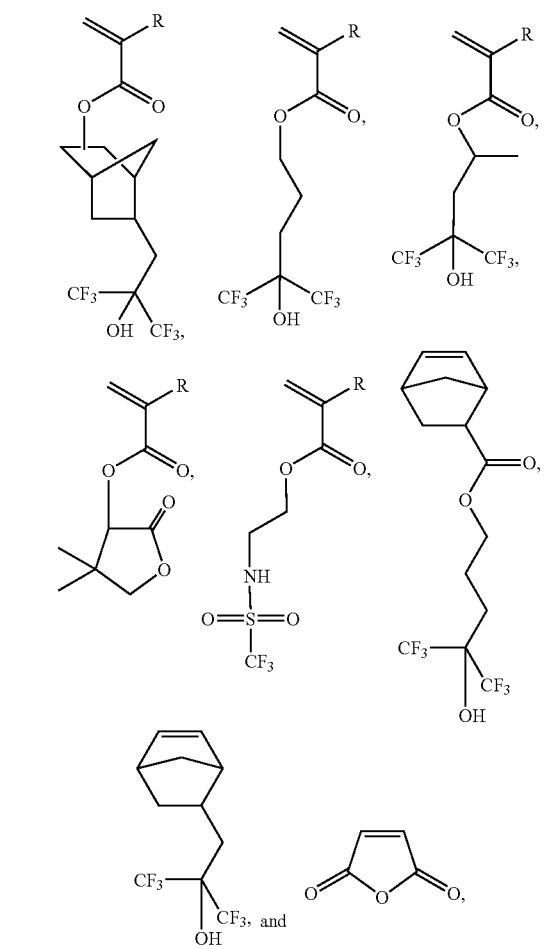

wherein:
   R is hydrogen or $CH_3$.

* * * * *

UNITED STATES PATENT AND TRADEMARK OFFICE
CERTIFICATE OF CORRECTION

PATENT NO. : 7,300,739 B2  Page 1 of 1
APPLICATION NO. : 10/449181
DATED : November 27, 2007
INVENTOR(S) : Robert D. Allen It is certified that error appears in the above-identified patent and that said Letters Patent is hereby corrected as shown below:

In claim 13, at column 27, line 24, should read

-- 13. The polymer of any one of claims 1, 5, and 10, further --.

Signed and Sealed this

Twenty-first Day of October, 2008

JON W. DUDAS
*Director of the United States Patent and Trademark Office*